United States Patent [19]

Meeker et al.

[11] Patent Number: 4,577,169

[45] Date of Patent: Mar. 18, 1986

[54] SMALL RIPPLE SURFACE ACOUSTIC WAVE FILTER WITH LOW INSERTION LOSS

[75] Inventors: Thrygve R. Meeker, Allentown; Wei-Shin Tsay, Fogelsville, both of Pa.

[73] Assignee: AT&T Bell Laboratories, Murray Hill, N.J.

[21] Appl. No.: 636,679

[22] Filed: Aug. 1, 1984

[51] Int. Cl.[4] ..................... H03H 9/64; H03H 9/145
[52] U.S. Cl. .................................. 333/194; 333/193; 333/196
[58] Field of Search ................................ 333/150–155, 333/193–196; 310/313 R, 313 A, 313 B, 313 C, 313 D

[56] References Cited

U.S. PATENT DOCUMENTS

| | | | |
|---|---|---|---|
| 4,006,438 | 2/1977 | Bennett | 310/313 C X |
| 4,013,983 | 3/1977 | Hartemann | 333/193 |
| 4,128,819 | 12/1978 | Shiokawa et al. | 333/194 |
| 4,130,813 | 12/1978 | Sandy et al. | 333/194 |
| 4,237,433 | 12/1980 | Tanski | 333/196 X |
| 4,276,524 | 6/1981 | Kadota | 333/194 |
| 4,308,510 | 12/1981 | Yamada et al. | 333/194 |
| 4,353,046 | 10/1982 | Hartmann | 333/194 |
| 4,429,246 | 1/1984 | Miyajima | 310/313 B |
| 4,499,440 | 2/1985 | Grudkowski | 310/313 R |

OTHER PUBLICATIONS

"Interdigital Electrode Configurations . . . ", *Reports of 1975 Spring Meeting Acoustical Society of Japan*, May 1975, H. Sato et al., pp. 305–306.
"Low Sidelobe SAW Filters . . . ", *1977 Ultrasonic Symposium Proceedings*, Oct. 1977, A. J. Slobodnik et al., pp. 757–762.
"A Low Loss Medium Bandwidth . . . ", *1978 Ultranics Symposium Proceedings*, Sep. 1978, R. C. Peach et al., pp. 509–512.
"Surface Acoustic Wave . . . ", *IEEE Trans. on Sonics and Ultrasonics*, vol. SU-26, No. 2, Mar. 1979, W. Tanski, pp. 93–104.
"Use of Apodized Metal Gratings . . . ", *1980 Ultrasonics Symposium Proceedings*, Nov. 1980, G. W. Judd et al., pp. 343–347.
"Frequency Sidelobes Generated by . . . ", *1982 Ultrasonics Symposium Proceedings*, Oct. 1982, W. A. Porter et al., pp. 35–39.
"SAW Filters Using Group-Type . . . ", ibid, R. C. Bray et al., pp. 227–232.

*Primary Examiner*—Marvin L. Nussbaum
*Attorney, Agent, or Firm*—Wendy W. Koba

[57] ABSTRACT

A surface acoustic wave (SAW) filter is disclosed which exhibits both low insertion loss and small ripple in the passband, requirements which were considered mutually exclusive in the prior art. In accordance with the present invention, apodized group-type recessed electrodes are utilized to form the transducers. The grouping of the electrodes functions to reduce reflection between electrodes and apodization of the electrodes functions to increase the sideband rejection. However, merely combining these techniques is inadequate since the apodization process produces additional ripple between adjacent electrodes, thus increasing the passband ripple. By recessing the apodized groups of electrodes, this reflection is minimized and a SAW filter formed in accordance with the present invention is thus capable of providing both low insertion loss and small ripple with high sideband rejection.

9 Claims, 5 Drawing Figures 500 kHz/DIV
APODIZED GROUP-TYPE TRANSDUCER
WITHOUT RECESSED ELECTRODES 500 kHz/DIV
RAISED APODIZATION GROUP-TYPE TRANSDUCER
WITH RECESSED ELECTRODES

SMALL RIPPLE SURFACE ACOUSTIC WAVE FILTER WITH LOW INSERTION LOSS

BACKGROUND OF THE INVENTION

1. Field of the Invention

The present invention relates to a low loss surface acoustic wave (SAW) filter and, more particularly, to a low loss SAW filter which utilizes apodized, group-type recessed electrodes to provide low insertion loss, high sideband rejection, and small passband ripple.

2. Description of the Prior Art

Surface acoustic wave filters often are of limited use due to ripple problems within the filtered band associated with either multiple reflections between the transmission and reception converters, or reflections between adjacent electrode fingers. Additionally, SAW filters often exhibit an unacceptable sideband rejection and insertion loss, where the presence of the high insertion loss requires peaking the gain of the post-amplifier, resulting in instability and intolerable temperature and aging and shifts of phase. One approach to solving the ripple problem is the utilization of an arrangement with high insertion loss, for example, 22 dB, to minimize the presence of the passband ripple. For most applications, however, insertion loss of 22 dB is unacceptable. One method for providing both low insertion loss and small ripple utilizes group-type electrodes, as discussed in the article "Interdigital Electrode Configurations Cancelling Internal Reflection" by H. Sato et al appearing in Reports of 1975 Spring Meeting, Acoustical Society of Japan, May 1975, at pp. 305–306. An exemplary structure may be composed of a 4-finger-group transducer and a 3-finger-group transducer. In each group, each finger is of $\lambda/4$ width with $\lambda/4$ spacing and opposite polarity from adjacent fingers. This sructure thus provides a cancellation of the internal acoustic reflection between the fingers, which is a major source of ripple. However, the group-type configuration exhibits a low sideband rejection which is often unacceptable.

Apodization is one generally recognized technique for increasing the sideband rejection of a SAW filter. In particular, apodization relates to varying the length of overlap region of adjacent electrodes of opposite polarity, according to a selected function of the electrode positions. U.S. Pat. No. 4,276,524 issued to M. Kadota on June 30, 1981, illustrates an surface acoustic wave device which utilizes apodized electrodes. As described by Kadota, the overlap between adjacent electrodes forms a pattern identical to the impulse response of the surface acoustic wave device. Therefore, by knowing the impulse response desired, the electrodes can be patterned to provide the desired frequency characteristics. The use of apodization with group-type electrodes, however, often introduces unacceptable ripple into the passband.

There exist in the prior art SAW devices which utilize recessed electrodes. One such arrangement is discussed in the article "Surface Acoustic Wave Resonators in Quartz" by W. Tanski, appearing in *IEEE Transactions on Sonics and Ultrasonics*, Vol. SU-26, No. 2, March 1979 at pp. 93–104. Here, a high-Q SAW resonator is formed which consists of recessed aluminum transducers and shallow reflecting grooves. The Tanski devices, however, are SAW resonators, not SAW transversal filters. Further, the use of recessed electrodes, which reduces reflection between adjacent electrodes, in standard interdigital transducers results in unacceptable passband distortion.

A remaining problem related to SAW filter design is the fact that the requirements of low insertion loss, small passband ripple and good sideband rejection are, in most cases, mutually exclusive. Therefore, there remains a need in the prior art for a SAW filter which simultaneously exhibits all of these qualities.

SUMMARY OF THE INVENTION

The problem remaining in the prior art has been solved in accordance with the present invention which relates to a low loss surface acoustic wave filter and, more particularly, to a SAW filter which exhibits low insertion loss, high sideband rejection, and small ripple by utilizing apodized, group-type electrodes which are recessed into the piezoelectric surface supporting the electrodes.

It is an aspect of the present invention to utilize recessed electrodes to substantially cancel the internal reflection between electrodes, as compared with the partial reduction achieved by the prior art group-type configuration.

Another aspect of the present invention is to utilize the prior art techniques of apodization and group-type configuration in order to provide the advantages of high sideband rejection and small passband ripple, respectively.

Other and further advantages of the present invention will become apparent during the course of the following discussion and by reference to the accompanying drawings.

BRIEF DESCRIPTION OF THE DRAWINGS

Referring now to the drawings where like numerals represent like parts in several views.

DETAILED DESCRIPTION

As stated above, for many of the newer applications of SAW filters the requirements for both small passband ripple and low insertion loss are often mutually exclusive. For example, a particular system may require an insertion loss of less than 10 dB and a ripple of less than 0.05 dB. High insertion loss of SAW filters requires peaking the gain of the post-amplifier, resulting in instability and intolerable temperature and aging shifts of phase. On the other hand, large ripple causes jitter peaking which could in turn cause the jitter to grow exponentially with the number of regenerators in a repeatered transmission line.

Although both of the above-described prior art techniques are related to solving these problems, the resultant combination of these two techniques, that is, apodized group-type transducers, will generally introduce ripples into the filter since the nonuniformity in the electrode overlap prevents complete cancellation of the internal reflection between adjacent electrodes. Therefore, in accordance with the present invention, recessed electrodes are utilized to minimize the apodization-induced residual reflection which the group-type configuration is not able to suppress.

Figure 1:
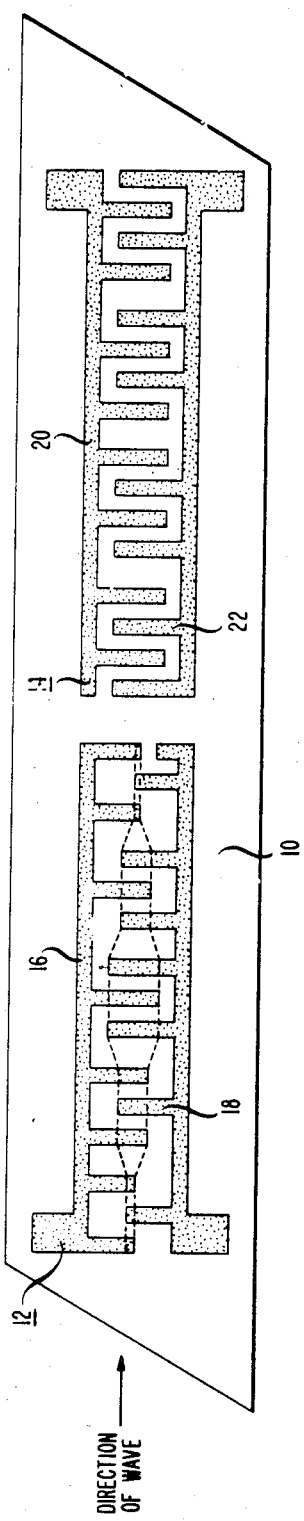
FIG. 1 illustrates a SAW filter including a 3-finger electrode group and a 4-finger electrode group formed in accordance with the present invention.

A low insertion loss, small ripple SAW filter formed in accordance with the present invention is illustrated in FIG. 1. As with conventional SAW filters, a piezoelectric, for example quartz, substrate 10 is utilized. The illustrated filter comprises a three finger-group transducer 12 and a four-finger-group transducer 14, where the terms "finger" and "electrode" may be used interchangeably. Three-finger-group transducer 12 includes a positive polarity electrode configuration 16 and a negative polarity electrode configuration 18 interleaved as shown to form what is referred to as an interdigital configuration. Similarly, four-finger-group transducer 14 comprises a positive polarity electrode configuration 20 and a negative polarity electrode configuration 22 also interleaved to form an interdigital configuration. In each group, each finger is of λ/4 width, with λ/4 spacing between adjacent fingers of opposite polarity. As shown, the spacing between each group is λ/2 and the polarity sequence alternates between every other group. This structure is utilized, as described hereinafter, so as to cancel the internal acoustic reflection between fingers, a major source of ripple. Further, the use of group-type electrodes has been found to reduce what is defined as triple transit echo which, in turn, allows for a reduction in insertion loss. Triple transit echo refers to the acoustic signal which is reflected by an output transducer and passes back into an input transducer. A portion of this signal is again reflected and reenters the output transducer. Therefore, the output transducer will receive an "echo" that is approximately 12 dB lower than the original signal. As stated above, the use of group-type electrodes further reduces the triple transit echo to a level below 12 dB.

As previously discussed, apodization is utilized to achieve higher rejection in the passband. This is done by varying the length of the region where adjacent electrodes of opposite polarity overlap according to a selected function of the electrode positions. This gives different weightings of the generated or detected acoustic wave amplitude at different electrode positions. This spatial distribution can be translated into a temporal distribution via the acoustic velocity, where the associated Fourier transform gives the frequency response of the filter. Therefore, by properly choosing the apodization function, a higher level of sideband rejection can be achieved compared to the unapodized transducer. In particular, two different apodization weighting functions of the cosine-squared type may be used, which can be expressed as $$W(t,T) = P + 0.5\cos\frac{2\pi t}{T} + 0.07\cos\frac{4\pi t}{T} \text{ for } |t| \leq T/2 \quad (1)$$

$$= 0 \text{ for } |t| > T/2,$$

where P=0.44 for full apodization or P=1.43 for raised apodization, and T is defined as the total length of the transducer. The difference between the full and raised apodizations is the pedestals of the weighting functions at the two ends of the transducer, which results in different degrees of sideband suppression and slight difference in the apodization loss. The overlap between adjacent electrodes in transducer 12 is illustrated in FIG. 1. It is to be noted that apodization is used only with input transducer 12, since the design of a SAW filter with apodized input and output transducers becomes extremely difficult, requiring the performance of a convolution between the two weighting functions. As can be seen, the overlap at first increases as the wave passes along transducer 12 from the first three-finger group to the second three-finger group, and again increases between the second three-finger group and the third three-finger group, where partially dotted horizontal lines denote the separation between adjacent electrode groups. The overlap between adjacent electrodes subsequently decreases between the third and fourth three-finger groups, and between the fourth and fifth three-finger groups. In accordance with equation (1), this pattern formed by the increase and decrease of electrode overlap, defined as the cosine-squared pattern, has a Fourier transform which exhibits extremely low sidelobes.

Figure 2:
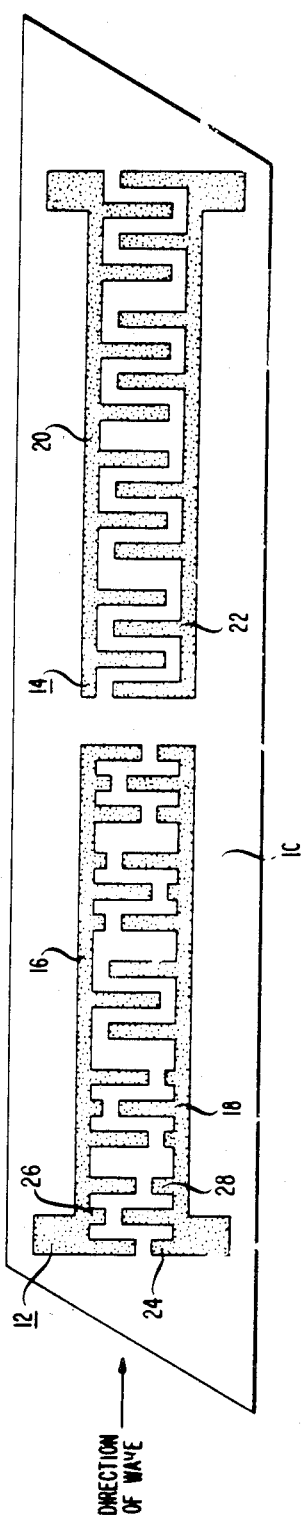
FIG. 2 illustrates the inclusion of dummy electrodes in the SAW filter illustrated in FIG. 1 which provide a uniform wavefront across the filter.

The non-uniform aperture that the acoustic wave experiences along the propagation path due to the apodization creates wavefront distortions which in turn produces severe passband distortion. Dummy fingers which do not have opposite polarity overlap with the nearest electrodes along the propagation path may be utilized in accordance with the present invention to maintain a uniform wavefront over the width W of the aperture. FIG. 2 illustrates SAW filter 10, where dummy electrodes are added to the configuration to lessen the distortion and maintain a uniform wavefront. For example, electrodes 24, 26, and 28 are dummy electrodes included in the first three-finger group of transducer 12 to maintain a uniform wavefront as the wave is launched into transducer in the direction illustrated in FIGS. 1 and 2. The slanted edges of quartz substrate 10 illustrated in FIGS. 1 and 2 are utilized to prevent the acoustic wave from being reflected back into the transducer, where this reflection would also cause severe passband distortion and ripples.

Figure 3:
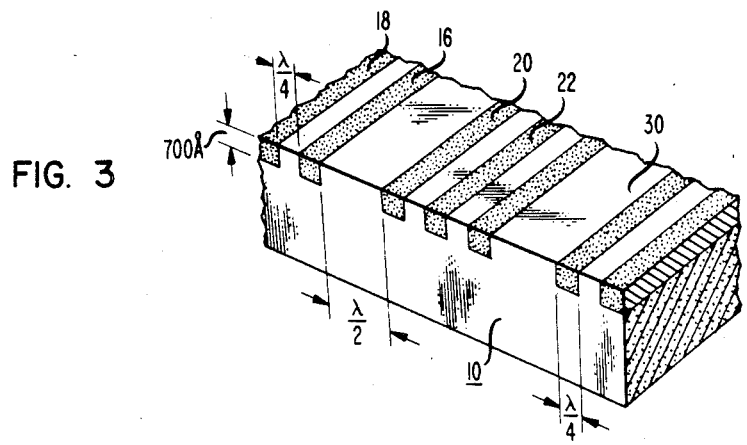
FIG. 3 illustrates a cross-sectional view of the SAW filter illustrated in FIG. 1.

In accordance with the present invention, recessed electrodes are utilized in place of prior art electrodes evaporated on the flat surface of piezoelectric material 10. The use of recessed electrodes functions to minimize the apodization-induced residual reflection which exists between adjacent electrodes. FIG. 3 illustrates a cross-sectional view of the filter illustrated in FIG. 1, showing the recessed electrodes. In formation, reactive ion etching techniques commonly known in the art may be utilized to bury aluminum electrodes in quartz with a flush surface, as shown in FIG. 3, where the electrodes are buried a distance of 700 Å from a top surface 30 of substrate 10. By forming the electrodes flush with top surface 30, the reflection coefficient associated with the apodization technique is greatly reduced. In one exemplary formation process, a quartz substrate 10 is first cleaned and primed with either Cr flash or HMDS (hexamethyldisilizane) to enhance the subsequent photoresist adhesion. The desired transducer pattern is then formed on the surface of quartz substrate 10 using well-known photolithographic techniques. Grooves are then etched into quartz substrate 10, using reactive ion etching as mentioned above, with a $CHF_3$ plasma to obtain the desired electrode depth, for example 700 Å. Copper-doped aluminum is subsequently evaporated into the grooves to form the electrodes, where the doping is utilized to increase the power aging threshold of the filter. Lastly, a lift-off process in acetone is utilized to yield the final device.

Figure 4:
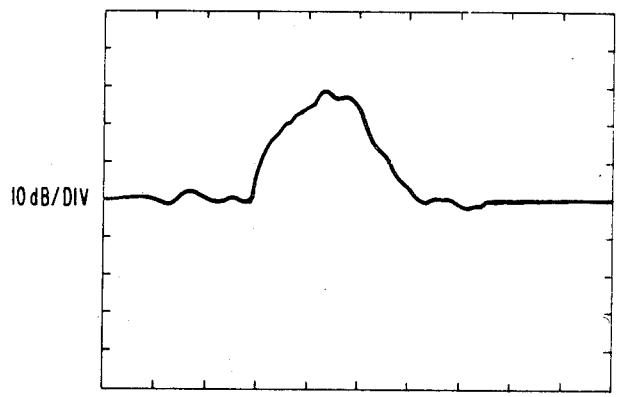
FIG. 4 illustrates the frequency response of a prior art apodized group-type transducer without recessed electrodes.
Figure 5:
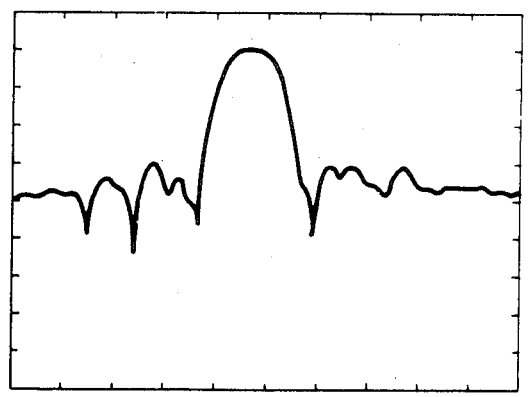
FIG. 5 illustrates the frequency response of an apodized group-type transducer utilizing recessed electrodes in accordance with the present invention.

FIGS. 4 and 5 illustrate the difference in performance between a prior art SAW filter and a SAW filter formed in accordance with the present invention utilizing apodized group-type transducers with recessed electrodes. As can be seen by reference to FIG. 4, without the use of recessed electrodes, the apodization-induced ripples are quite noticeable. These ripples, as stated above, are minimized by the present technique, which combines the use of recessed electrodes with group-type apodized electrodes. FIG. 5 illustrates the frequency response of a SAW filter formed in accordance with the present invention. The apodization weighting function used for this exemplary filter design is the raised apodization described above in association with equation (1). The realized sideband rejection for this arrangement is approximately 30 dB, compared with 21 dB for comparable prior art arrangements which do not utilize apodized electrodes.

What is claimed is:

1. A surface acoustic wave filter comprising substrate means having at least a major surface layer of a piezoelectric material;

an input transducer for transforming an electrical input signal into an acoustical signal, said input transducer including a first electrode responsive to an input signal of positive polarity and a second electrode responsive to an input signal of negative polarity, each electrode being recessed into said substrate means to be essentially coplanar with said major surface layer and comprising a plurality of electrode fingers, said positive and negative electrode fingers being interleaved to form an interdigitated electrode finger configuration and disposed to form a plurality of finger groups capable of reducing reflection between adjacent electrode fingers, each group including a set of N equal length finger electrodes of both positive and negative polarity, said input transducer being apodized such that adjacent finger groups comprise electrode fingers of different lengths perpendicular to the direction of travel of a surface acoustic wave, wherein the different lengths are determined in accordance with a predetermined apodization equation ($W(t,T)$); and an output transducer including a first electrode of positive polarity and a second electrode of negative polarity, each electrode responsive to the acoustic signal generated by said input transducer for providing as an output an associated electrical signal, each electrode being recessed into said substrate means to be essentially coplanar with said major surface layer and comprising a plurality of electrode fingers, said positive and negative electrode fingers being interleaved to form an interdigitated electrode finger configuration and disposed to form a plurality of finger groups capable of reducing reflection between adjacent electrode fingers, each group including a set of M fingers of both positive and negative polarity, M being different from N.

2. A surface acoustic wave filter as defined in claim 1 wherein each finger electrode comprises a width equal to $\lambda/4$, the spacing between adjacent finger groups is equal to $\lambda/2, \lambda = V/f$, f being defined as the center frequency of said surface surface acoustic wave filter and v being defined as the acoustic velocity.

3. A surface acoustic wave filter as defined in claim 1 wherein the predefined apodization equation is in the form of $W(t,T) = 0.44 + 0.5 \cos 2\pi t/T + 0.07 \cos 4\pi t/T$.

4. A surface acoustic wave filter as defined in claim 1 wherein the predefined apodization equation is in the form of $W(t,T) = 1.43 + 0.5 \cos 2\pi t/T + 0.07 \cos 4\pi t/T$.

5. A surface acoustic wave filter as defined in claim 1 wherein
each finger group of the input transducer comprises three separate electrodes (N=3); and
each finger group of the output transducer comprises four separate electrodes (M=4).

6. A surface acoustic wave filter as defined in claim 1 wherein the piezoelectric surface of the substrate means comprises quartz.

7. A surface acoustic wave filter as defined in claim 1 wherein the electrodes are recessed to a depth of 700 Å in the piezoelectric surface.

8. A surface acoustic wave filter as defined in claim 1 wherein the electrodes comprise aluminum.

9. A surface acoustic wave filter as defined in claim 8 wherein the electrodes further comprise a copper dopant.

* * * * *